United States Patent [19]
Kirk et al.

[11] Patent Number: 5,325,264
[45] Date of Patent: Jun. 28, 1994

[54] DEVICE FOR REMOVING A DIRECT ACCESS STORAGE DEVICE FROM A PERSONAL COMPUTER

[75] Inventors: Richard D. Kirk, Boynton Beach; Mark C. McPherson, Boca Raton; Brian A. Trumbo, Boynton Beach, all of Fla.

[73] Assignee: IBM Corporation, Armonk, N.Y.

[21] Appl. No.: 556,925

[22] Filed: Jul. 20, 1990

[51] Int. Cl.⁵ .................... H05K 7/02; H01R 13/629; B25B 27/02; G06F 1/16
[52] U.S. Cl. .................... 361/685; 361/727; 361/754; 361/798; 439/157; 29/270; 254/131
[58] Field of Search ............... 439/157, 160, 372, 152; D8/88, 89; 312/223.2, 333; 254/131, 133 R; 29/270, 278; 361/380, 391, 415, 679, 683-686, 725-727, 731, 754, 798; 360/137; 364/708.1

[56] References Cited
U.S. PATENT DOCUMENTS

| | | | |
|---|---|---|---|
| 977,986 | 12/1910 | Waddell | 254/131 |
| 2,609,268 | 9/1952 | Nye | 439/160 X |
| 2,976,510 | 3/1961 | Blain | 361/415 X |
| 4,894,792 | 1/1990 | Mitchell et al. | 364/708 |
| 4,991,058 | 2/1991 | Watkins et al. | 361/391 |

OTHER PUBLICATIONS

IBM Technical Disclosure Bulletin, vol. 28, No. 9, pp. 3877 and 3878, Feb. 1986, "Diskette Drive Single Control, Low Power Interface", Copy in 361-380.

Primary Examiner—Leo P. Picard
Assistant Examiner—Michael W. Phillips
Attorney, Agent, or Firm—Daniel E. McConnell

[57] ABSTRACT

This disclosure relates to a personal computer apparatus and a device for removing a direct access storage device from a personal computer. More particularly, this disclosure describes a tool for easily removing an electromechanical storage device such as hard disk drive which is directly attached to the bus structure provided by a planar board or motherboard of a personal computer system.

7 Claims, 6 Drawing Sheets

DEVICE FOR REMOVING A DIRECT ACCESS STORAGE DEVICE FROM A PERSONAL COMPUTER

FIELD AND BACKGROUND OF INVENTION

This disclosure relates to a personal computer apparatus and a device for removing a direct access storage device from a personal computer. More particularly, this disclosure describes a tool for easily removing an electromechanical storage device such as hard disk drive which is directly attached to the bus structure provided by a planar board or motherboard of a personal computer system.

Personal computer systems in general and IBM personal computers in particular have attained widespread use for providing computing capability to many segments of today's modern society. Personal computer systems can usually be defined as a desk top, floor standing, or portable microcomputer that consists of a system unit having a single system processor and associated volatile and non-volatile memory, a display monitor, a keyboard, one or more electromechanical direct access storage devices (DASD), and an optional printer. One of the distinguishing characteristics of these systems is the use of a motherboard or system planar board to electrically connect these components. These systems are designed primarily to give independent computing capability to a single user and are inexpensively priced for purchase by individuals or small businesses. Examples of such personal computer systems are IBM's PERSONAL COMPUTER AT and IBM's PERSONAL SYSTEM/2 Models 25, 30, 50, 60, 70 and 80. The phrases "AT" and "PERSONAL SYSTEM/2" are trademarks of International Business Machines Corporation.

Heretofore, the conventional practice in providing for data transfer between components of the personal computer located on the planar board (which receive digital data as input from various elements of the system and deliver such data as output to various elements of the system) and an electromechanical direct access storage device has been to interpose a controller card, controller circuitry or the like between the bus or buses provided on the planar board and the storage device or DASD. Typically, data is communicated through electrical connections established by flexible conductors or cables extending between the controller and the storage device.

While such connections between the planar board and DASD have functioned successfully and have become an industry standard, it is recognized that there are problems associated with those connections. Some of those problems relate to the attention to detail necessary during initial assembly or subsequent reassembly of the computer system. The necessity of giving such attention increases the cost of manufacture and the possibility of error in assembly. Further, the cabling required increases the number of components to be stocked, the space required in the assembly, and the possibilities for emitting electromagnetic interference.

One solution recently proposed for the difficulties presented by the prior practices described, and which is the subject matter of co-pending U.S. application Ser. No. 537,655 filed Jun. 14, 1990 and owned in common with the subject matter here described, has been to provide a DASD which is directly connected to the bus structure of a planar board. While such a solution provides significant advantages, the use of a direct attachment DASD and limited assembly and disassembly space raises problems in removing the DASD in the event that service is necessary or upgrading is to be done. Indeed, in any machine environment in which obtaining access to a DASD is made difficult by space limitations, there is increased risk that efforts to exert on a DASD force sufficient to separate it from its connections and mounting may damage the DASD.

BRIEF DESCRIPTION OF INVENTION

With the foregoing in mind, it is an object of this invention to provide for a tool for readily and easily separating an electromechanical direct access storage device from its connections to a personal computer. In realizing this object of the present invention, the potential for damaging a DASD by purely manual exertion of force is avoided.

Yet a further object of this invention is to provide a device for disassembling a personal computer which facilitates servicing of the computer. In realizing this object of the present invention, a tool to be used in disassembling a personal computer is mounted within the enclosure of the personal computer, so as to be readily available when needed.

BRIEF DESCRIPTION OF DRAWINGS

Some of the objects of the invention having been stated, other objects will appear as the description proceeds when taken in connection with the accompanying drawings, in which.

DETAILED DESCRIPTION OF INVENTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Figure 1:
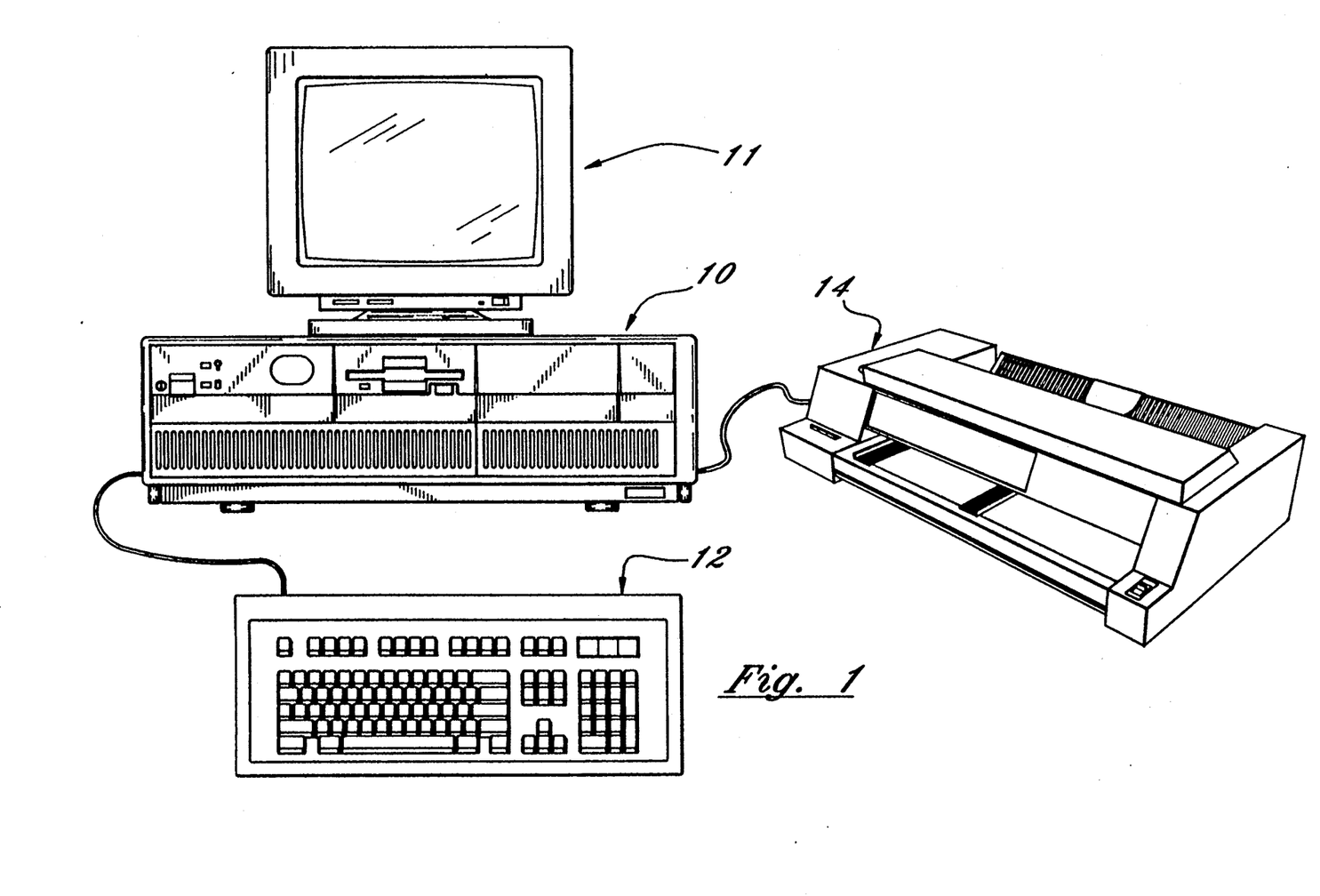
FIG. 1 is a perspective view of a personal computer embodying this invention.

Referring now more particularly to the accompanying drawings, a microcomputer embodying the present invention is there shown and generally indicated at 10 (FIG. 1). As mentioned hereinabove, the computer 10 may have an associated monitor 11, keyboard 12 and printer or plotter 14. The computer 10 has a cover 15 formed by a decorative outer member 16 (FIG. 2) and an inner shield member 18 which cooperate with a chassis 19 in defining an enclosed, shielded volume for receiving electrically powered data processing and storage components for processing and storing digital data. At least certain of these components are mounted on a planar 20 which is mounted on the chassis 19 and provides a means for electrically interconnecting the components of the computer 10 including those identified above and such other associated elements as floppy disk drives, various forms of direct access storage devices, accessory cards or boards, and the like.

Figure 2:
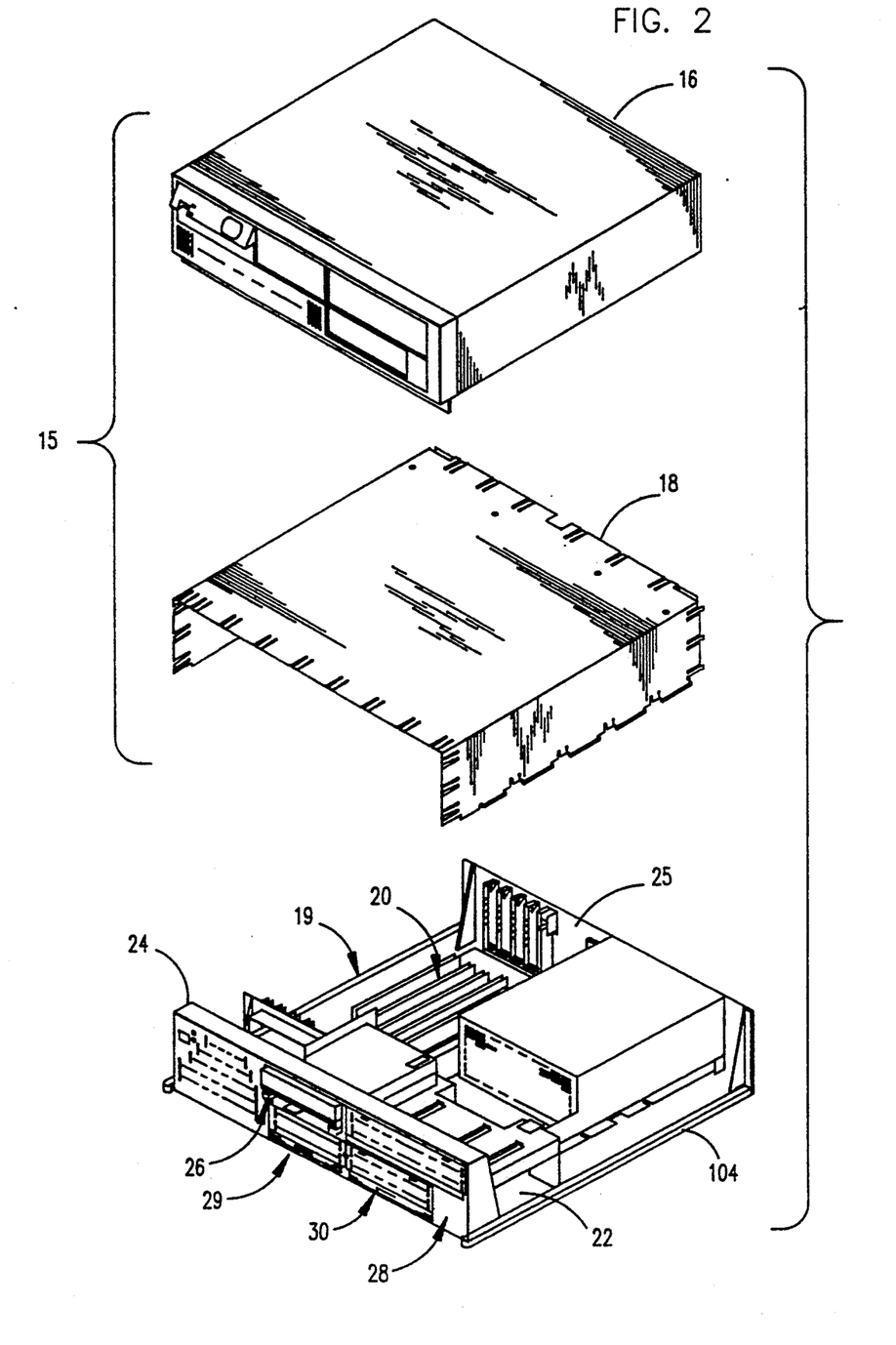
FIG. 2 is an exploded perspective view of certain elements of the personal computer of FIG. 1 including a chassis, a cover, an electromechanical direct access storage device and a planar board, and illustrating certain relationships among those elements.

The chassis 19 has a base indicated at 22, a front panel indicated at 24, and a rear panel indicated at 25 (FIG. 2). The front panel 24 defines at least one open bay (and in the form illustrated, four bays) for receiving a data storage device such as a disk drive for magnetic or optical disks, a tape backup drive, or the like. In the illustrated form, a pair of upper bays 26, 28 and a pair of lower bays 29, 30 are provided. One of the upper bays 26 is adapted to receive peripheral drives of a first size (such as those known as 3.5 inch drives) while the other bay 28 is adapted to receive drives of a selected one of two sizes (such as 3.5 and 5.25 inch) and the lower bays are adapted to receive devices of only one size (3.5 inch).

Figure 3:
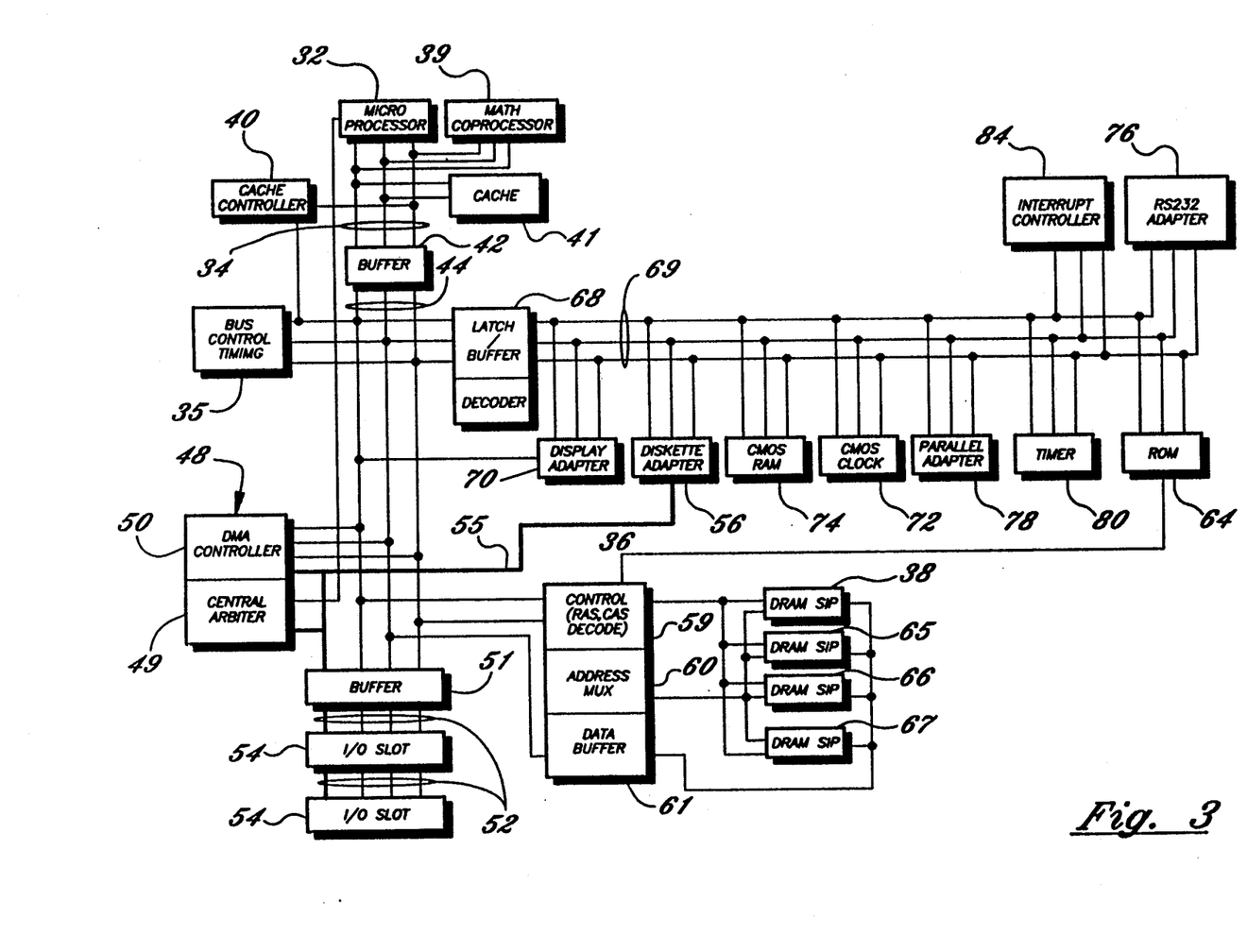
FIG. 3 is a schematic view of certain components of the personal computer of FIGS. 1 and 2.
Figure 4:
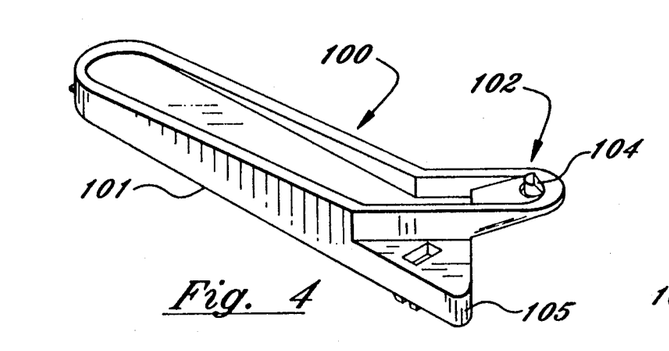
FIG. 4 is a perspective view of a tool in accordance with this invention.
Figure 5:
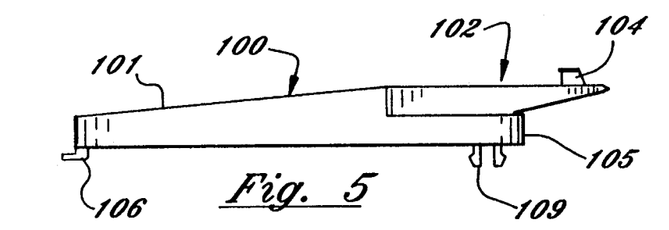
FIG. 5 is a right side elevation view of the tool of FIG. 4.
Figure 6:
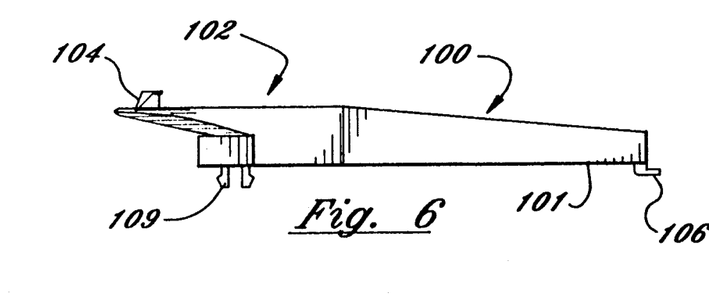
FIG. 6 is a left side elevation view of the tool of FIG. 4.

Prior to relating the above structure to the present invention, a summary of the operation in general of the personal computer system 10 may merit review. Referring to FIG. 3, there is shown a block diagram of a personal computer system illustrating the various components of the computer system such as the system 10 in accordance with the present invention, including components mounted on the planar 20 and the connection of the planar to the I/O slots and other hardware of the personal computer system. Connected to the planar is the system processor 32 comprised of a microprocessor which is connected by a high speed CPU local bus 34 through a bus control timing unit 35 to a memory control unit 36 which is further connected to a volatile random access memory (RAM) 38. While any appropriate microprocessor can be used, one suitable microprocessor is the 80386 which is sold by INTEL.

While the present invention is described hereinafter with particular reference to the system block diagram of FIG. 3, it is to be understood at the outset of the description which follows that it is contemplated that the apparatus and methods in accordance with the present invention may be used with other hardware configurations of the planar board. For example, the system processor could be an Intel 80286 or 80486 microprocessor.

Returning now to FIG. 3, the CPU local bus 34 (comprising data, address and control components) provides for the connection of the microprocessor 32, a math coprocessor 39, a cache controller 40, and a cache memory 41. Also coupled on the CPU local bus 24 is a buffer 42. The buffer 42 is itself connected to a slower speed (compared to the CPU local bus) system bus 44, also comprising address, data and control components. The system bus 44 extends between the buffer 42 and a further buffer 51. The system bus 44 is further connected to a bus control and timing unit 35 and a DMA unit 48. The DMA unit 48 is comprised of a central arbitration unit 49 and DMA controller 50. The buffer 51 provides an interface between the system bus 44 and an optional feature bus such as the MICRO CHANNEL bus 52. Connected to the bus 52 are a plurality of I/O slots 54 for receiving MICRO CHANNEL adapter cards which may be further connected to an I/O device or memory.

An arbitration control bus 55 couples the DMA controller 50 and central arbitration unit 49 to the I/O slots 54 and a diskette adapter 56. Also connected to the system bus 44 is a memory control unit 36 which is comprised of a memory controller 59, an address multiplexor 60, and a data buffer 61. The memory control unit 36 is further connected to a random access memory as represented by the RAM module 38. The memory controller 36 includes the logic for mapping addresses to and from the microprocessor 32 to particular areas of RAM 38. This logic is used to reclaim RAM previously occupied by BIOS (Basic Input Output System). Further generated by memory controller 36 is a ROM select signal (ROMSEL), that is used to enable or disable ROM 64.

While the microcomputer system 10 is shown with a basic 1 megabyte RAM module, it is understood that additional memory can be interconnected as represented in FIG. 3 by the optional memory modules 65 through 67. For purposes of illustration only, the present invention is described with reference to the basic one megabyte memory module 38.

A further buffer 68 is coupled between the system bus 44 and a planar I/O bus 69. The planar I/O bus 69 includes address, data, and control components respectively. Coupled along the planar bus 69 are a variety of I/O adapters and other components such as the display adapter 70 (which is used to drive the monitor 11), a clock 72, nonvolatile RAM 74 herein after referred to as NVRAM, a RS232 adapter 76, a parallel adapter 78, a plurality of timers 80, a diskette adapter 56, an interrupt controller 84, and a read only memory 64. The read only memory 64 includes the BIOS that is used to interface between the I/O devices and the operating system of the microprocessor 32. BIOS stored in ROM 64 can be copied into RAM 38 to decrease the execution time of BIOS. ROM 64 is further responsive (via ROMSEL signal) to memory controller 36. If ROM 64 is enabled by memory controller 36, BIOS is executed out of ROM. If ROM 64 is disabled by memory controller 36, ROM is not responsive to address enquiries from the microprocessor 32 (i.e. BIOS is executed out of RAM).

The clock 72 is used for time of day calculations and the NVRAM is used to store system configuration data.

That is, the NVRAM will contain values which describe the present configuration of the system. For example, NVRAM contains information describing the capacity of a fixed disk or diskette, the type of display, the amount of memory, time, date, etc. Of particular importance NVRAM will contain data (can be one bit) which is used by memory controller 36 to determine whether BIOS is run out of ROM or RAM and whether to reclaim RAM intended to be used by BIOS RAM. Furthermore, these data are stored in NVRAM whenever a special configuration program, such as SET Configuration, is executed. The purpose of the SET Configuration program is to store values characterizing the configuration of the system to NVRAM.

The personal computer apparatus 10 shown in the drawings has an electromechanical direct access storage device 90 for storing and delivering digital data. The device 90 may be a device which uses magnetic media such as a fixed or hard disk drive or a device which uses optical media such as the drive known as a compact disc drive. The computer may be provided with multiple drives, although only a single drive has been shown. The drive has an elongate first connector for establishing operative connections for the transfer of data to and from the storage device. Preferably, and as illustrated, each connector (91 for device 90) is a card edge connector defined by a plurality of strips of conductive material extending parallel one to another and spaced apart along, and perpendicular to, an edge of a circuit card. The circuit card (not visible in its entirety in the drawings) underlies the drive device, is mounted to the drive device, and defines a plane.

As described hereinabove, the personal computer also comprises a planar board for mounting circuit components for processing digital data. The planar board 35 has an elongate second connector 92 mounted directly on the planar board for establishing direct operative connection between the bus or buses provided on the planar board and the storage device 90. The bus or buses are typically provided by conductive pathways formed on or in the planar board as is well known. The second connector preferably is a socket for receiving the first connector. Thus the first and second connectors are a mating pair of male and female connectors. The planar board, as indicated by its name and is well known, is a circuit board which defines a plane as do the circuit cards or boards which underlie the drive device to be mounted and which are described hereinabove.

The personal computer is provided with means for positioning the storage device 90 and the planar board 20 one relative to the other so that the first connector 91 and the second connector 92 mate. When the connectors are mated, the planar board and the circuit board underlying the drive device are parallel and, in the embodiment shown, slightly vertically spaced one from another. In the form illustrated, and as preferred for this invention, such positioning means takes the form of a guide tray or support 94 and a cooperating slide 95. As described more fully hereinafter, the support 94 is secured adjacent the planar board during assembly of the personal computer, while the slide 95 is secured to the storage device 90. When the storage device is moved toward the planar board during assembly, the slide 95 and support 94 cooperate to guide the storage device into position and latch it in place. The slide 95 has a tongue portion with a latching projection 96 and an extraction catch 98. The latching projection 96 enters into a receiving notch or groove in the support 94 when the drive is firmly seated in operating position, and retains the drive in that position. The extraction catch (illustrated in the form of a simple hole in the tongue portion of the slide 95) serves as described more fully hereinafter in enabling extraction of the drive from the personal computer.

In a personal computer which embodies this invention, the planar board 20 is secured in the chassis 19 having a front frame member 24 with the second connector 92 directed toward an opening provided in the front frame (and known as a "bay") for storage devices. The support 94 is similarly secured in the chassis 19, and the slide 95 to a storage device. Thereafter, a storage device such as the device 90 may be inserted into a bay from the front of the chassis, moved into position to align the corresponding first and second connectors 91, 92, and then pushed into the latched position as the connectors are coupled.

As will be understood, such coupling provides a direct connection between the storage device and the bus supplied by the planar board, absent any interposed accessory card, cable or the like. Further, the coupling is accomplished with front access, thereby simplifying the installation and removal of a storage device, and with the boards associated with the devices positioned parallel to the planar board.

Figure 11:
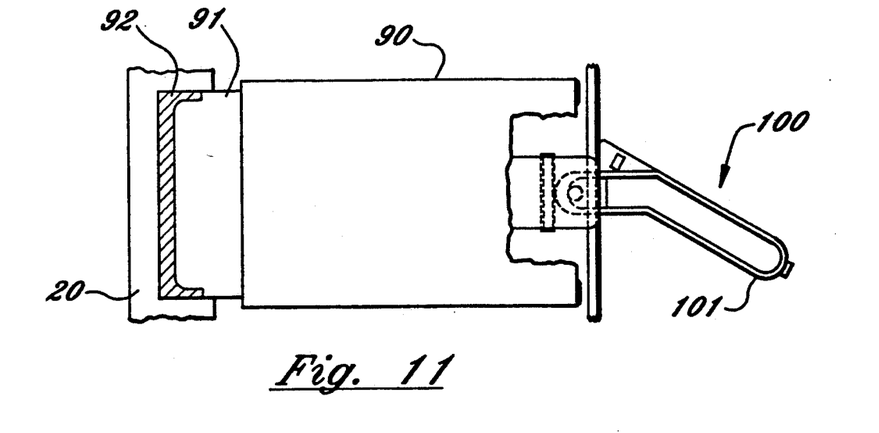
FIG. 11 is a plan view of a DASD as installed in a computer in accordance with this invention, with the tool of FIGS. 4 through 10 positioned for use in removal of the DASD.
Figure 12:
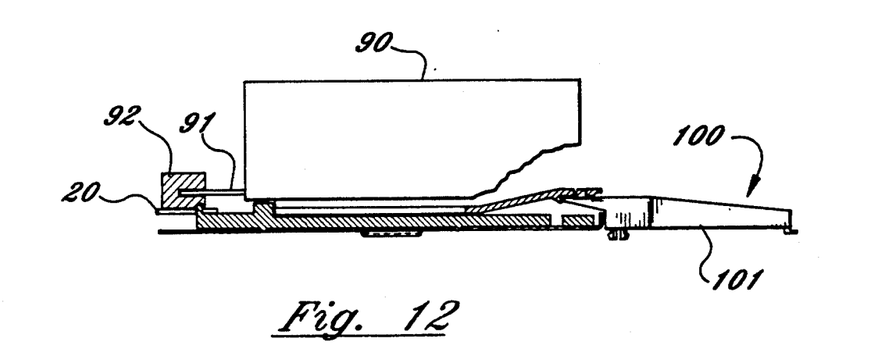
FIG. 12 is a side elevation view of the apparatus shown in FIG. 11.
Figure 13:
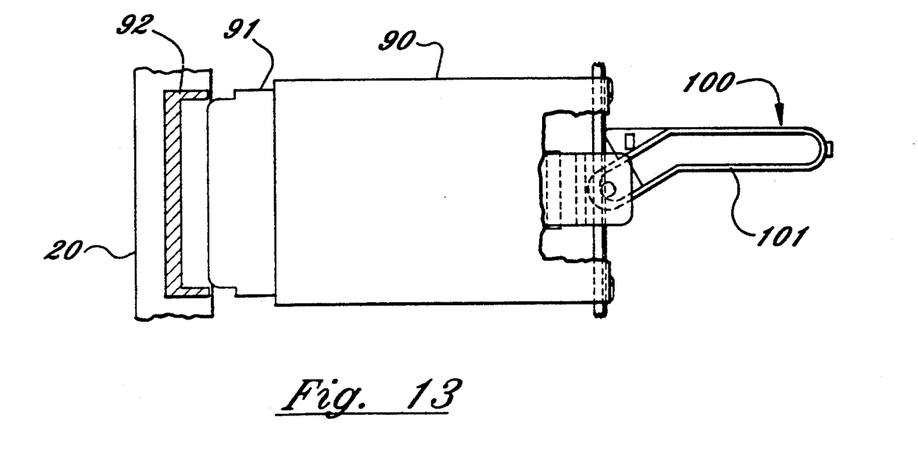
FIG. 13 is a view similar to FIG. 11, showing the DASD as levered out of position by operation of the tool.
Figures 14, 15, 16:
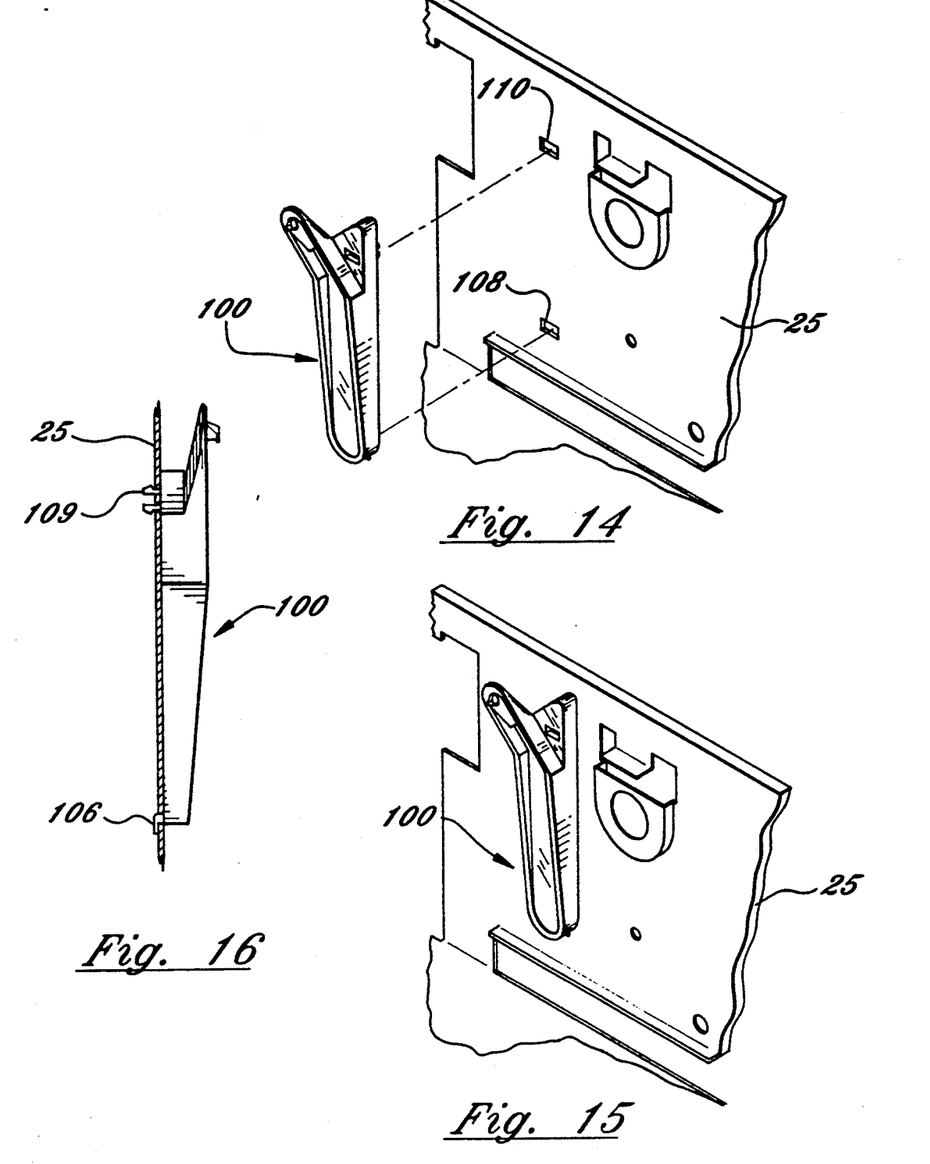
FIG. 14 is an exploded perspective view showing the mounting of the tool of FIGS. 4 through 10 within the enclosure of the personal computer of FIGS. 1 and 2 when stored between occasions of use.
FIG. 15 is a perspective view similar to FIG. 14 showing the tool retained in storage position.
FIG. 16 is a side elevation view of the tool in storage position.

In accordance with the present invention, removal of the DASD 90 is accomplished through the use of a device shown in FIGS. 4 through 10; used as shown in FIGS. 11 through 13; and stored as shown in FIGS. 14 through 16. The tool is generally indicated at 100, and its characteristics, use and storage will be described hereinafter.

The tool 100, in accordance with this invention, engages the positioning means and is manually operable for exerting on the first and second connectors force perpendicular to the length thereof and effective for separating the connectors and thereby enabling damage free removal of the storage device from the planar board. The tool 100 has an elongate handle portion 101 for being manually gripped by a user and an extraction portion indicated at 102 at one end of the handle portion for engaging the drive positioning means. Preferably, the extraction portion is formed at one end of the handle portion and has certain characteristics as described more fully hereinafter.

Figure 7:
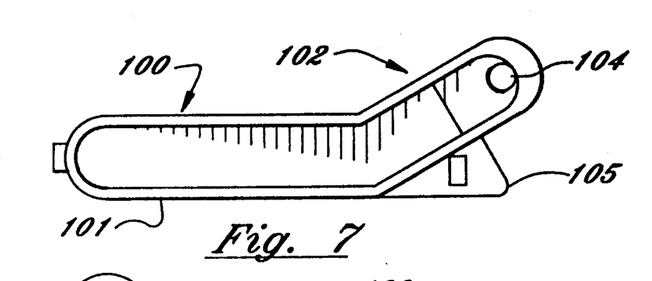
FIG. 7 is a plan view of the tool of FIG. 4.
Figures 8, 9, 10:
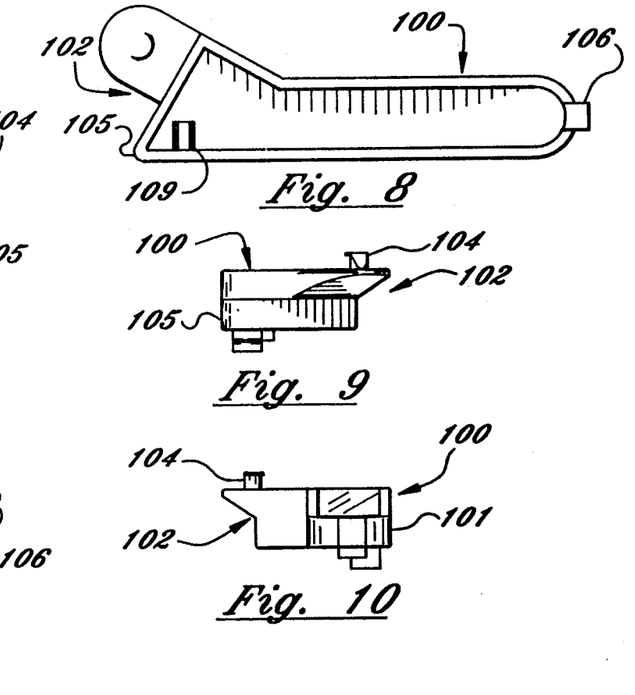
FIG. 8 is a bottom view of the tool of FIG. 4.
FIG. 9 is an end elevation view of the tool of FIG. 4, taken as from the right hand end of FIGS. 5 and 7.
FIG. 10 is an end elevation view of the tool of FIG. 4, taken as from the left hand end of FIGS. 5 and 7.

The extraction portion 102 has a tapered nose portion for wedging insertion between the guide support 94 and slide 95 (FIG. 12) and for separating the support and slide one from the other. The extraction portion 102 also has a projection 104 for engaging the extraction catch 98 and for exerting on the catch and the tongue portion the aforementioned force effective for separating the connectors. In order to enable the exertion of the force, the extraction portion 102 defines a fulcrum 105, located relative to the projection 104 and the handle portion 101 to cause the tool to act as a lever of the first class. That is, the handle acts as a lever in which the fulcrum is located between the point at which force is applied and the point at which the lever applies force. As is well known, such a lever is capable of multiplying force in a ratio determined by the relative distance of the force exertion points from the fulcrum. In the form shown, the fulcrum 105 is displaced to one side of a line extending between the projection and the extremity of the handle portion 101 (FIG. 7).

Desirably, the tool 100 is made as an injection molded part of a material selected to have the necessary strength to function as a lever as here described.

When not in use, the tool 100 is stored within the enclosure of the personal computer 10, as illustrated in FIGS. 14 through 16. As there shown, one of the upright panels of the chassis, such as the rear panel 25, has a pattern of holes formed therein which receives mounting projections formed on the tool 100. More particularly, the tool has a handle end mounting projection 106 which is received in a corresponding opening 108 for permitting pivoting movement of the tool and a locking projection 109, formed by a pair of protrusions, which snaps or frictionally fits into a corresponding opening 110 for retaining the tool in stored position. As so stored, the tool 100 is readily available for use by a person needing to remove a hardfile from the computer 10.

In use, the tool 100 is removed from the stored position, and manipulated to insert the tapered nose of the extraction portion between the tongue of the slide 95 and the underlying guide 94. The tool may then be manipulated to lift the tongue, releasing the catch which otherwise retains the hardfile 90 in position, and inserting the extraction projection 104 into the catch 98 for enabling exertion of the extraction force perpendicular to the longitudinal axis of the connectors 91, 92 (FIG. 12). Thereafter, the tool may be manipulated to move from the position shown in FIG. 11 to that shown in FIG. 13 and lever the DASD from its mounting connection, avoiding the risk of damage which otherwise arises from attempts to apply such forces directly to the DASD device. As so used, the tool 100 is adaptable to use by one hand of a user, and is thus quite convenient.

In the drawings and specifications there has been set forth a preferred embodiment of the invention and, although specific terms are used, the description thus given uses terminology in a generic and descriptive sense only and not for purposes of limitation.

What is claimed is:

1. A personal computer apparatus comprising:
   digital data processing circuit components,
   at least one electromechanical direct access storage device for storing and delivering digital data and having a circuit board and an elongate first connector mounted on said circuit board for establishing operative connections for the transfer of data to and from the storage device,
   a planar board for mounting said circuit components and having an elongate second connector mounted on said planar board for establishing direct operative connection between said planar board and said storage device,
   a guide support and a slide for positioning said storage device and said planar board one relative to the other for mating of said first and second connectors and with said circuit board parallel to said planar board, said slide having a tongue portion with a latching projection and an extraction catch, and
   a tool having an elongate handle portion for being manually gripped by a user and an extraction portion at one end of said handle portion for engaging said slide, said extraction portion having a projection for engaging said extraction catch, and said tool being manually operable for exerting on said extraction catch and tongue portion force effective for exerting on said first and second connectors force perpendicular to the length of said connectors for separating said connectors and thereby enabling damage free removal of said storage device from said planar board.

2. Apparatus according to claim 1 wherein said extraction portion of said tool defines a tapered nose portion for wedging insertion between said guide support and said slide and for separating said guide support and said slide one from the other.

3. Apparatus according to claim 1 wherein said extraction portion of said tool defines a fulcrum and a projection, and further wherein said fulcrum is positioned to one side of a line extending between said projection and the extremity of said handle portion.

4. Apparatus according to claim 1 wherein said tool comprises a lever of the first class.

5. A personal computer apparatus comprising:
   digital data processing circuit components,
   at least one electromechanical direct access storage device for receiving, storing and delivering digital data and having a circuit card and an elongate first connector for establishing operative connections for the transfer of data to and from the storage device, said first connector comprising a male card edge connector defined by a plurality of strips of conductive material extending parallel one to another and spaced apart along, and perpendicular to, an edge of said circuit card,
   a planar board for mounting said circuit components and having an elongate second connector mounted on said planar board for establishing direct operative connection between said planar board and said storage device, said second connector comprising a female socket for receiving said first connector,
   a guide support and a slide for positioning said storage device and said planar board one relative to the other for mating of said first and second connectors and with said circuit board parallel to said planar board, said slide having a tongue portion with a latching projection and an extraction catch, and
   a leveraging tool having an elongate handle portion for being manually gripped by a user and an extraction portion at one end of said handle portion for engaging said extraction catch, said tool being manually operable for exerting on said catch and said tongue portion and thereby on said first and second connectors force perpendicular to the length of said connectors and effective for separating said connectors and thereby enabling damage free removal of said storage device from said planar board.

6. A personal computer apparatus having a high speed system processor compatible with application programs and operating system software designed to execute on slower speed system processors, said personal computer apparatus comprising:
   a high speed microprocessor having a real and protected mode of operation coupled to a high speed data bus;
   non-volatile memory electrically coupled to a slower speed data bus;
   a bus controller for providing communications between the high speed data bus and the slower speed data bus;
   volatile memory electrically responsive to the high speed data bus;
   a memory controller electrically coupled to said volatile memory and said non-volatile memory, said memory controller regulating communications between said volatile memory and said high speed microprocessor;

at least one electromechanical direct access storage device for storing and delivering digital data and having a circuit card and an elongate first connector for establishing operative connections for the transfer of data to and from the storage device, said first connector comprising a male card edge connector defined by a plurality of strips of conductive material extending parallel one to another and spaced apart along, and perpendicular to, an edge of said circuit card, a planar board for mounting said microprocessor and said non-volatile memory and said bus controller and said volatile memory for processing digital data and having an elongate second connector mounted on said planar board for establishing direct operative connection between said planar board and said storage device, said second connector comprising a female socket for receiving said first connector, and a guide support and a slide for positioning said storage device and said planar board one relative to the other for mating of said first and second connectors and with said circuit board parallel to said planar board, said slide having a tongue portion with a latching projection and an extraction catch, and a leveraging tool having an elongate handle portion for being manually gripped by a user and an extraction portion at one end of said handle portion for engaging said extraction catch, said tool being manually operable for exerting on said catch and tongue portion and thereby on said first and second connectors force perpendicular to the length of said connectors and effective for separating said connectors and thereby enabling damage free removal of said storage device from said planar board.

7. A tool for removing an electromechanical direct access storage device from a personal computer and comprising:

an elongate handle portion for being manually gripped by a user, and an extraction portion at one end of said handle portion, said extraction portion defining:

(i) a tapered nose portion having a wedge surface for wedging insertion between a storage device guide support and storage device slide for separating the guide support and slide one from the other, (ii) a projection for engaging a storage device extraction catch and for exerting on the catch a force effective for separating a storage device from a coupled position, and (iii) a fulcrum positioned to one side of a line extending between said projection and the extremity of said handle portion so that the tool functions as a lever of the first class, said projection being located on said tool in spaced relation from said wedge surface and extending from said tool in a first direction generally perpendicular to said wedge surface and said fulcrum being located on said tool adjacent said wedge surface and on an opposite side thereof from said projection.

* * * * *